United States Patent
Yanagiya (10) Patent No.: US 9,068,259 B2
(45) Date of Patent: Jun. 30, 2015

(54) AC POWER SUPPLY FOR SPUTTERING APPARATUS

(75) Inventor: Yoshio Yanagiya, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 378 days.

(21) Appl. No.: 13/148,154

(22) PCT Filed: Feb. 15, 2010

(86) PCT No.: PCT/JP2010/000915
§ 371 (c)(1),
(2), (4) Date: Aug. 9, 2011

(87) PCT Pub. No.: WO2010/100835
PCT Pub. Date: Sep. 10, 2010

(65) Prior Publication Data
US 2011/0303534 A1    Dec. 15, 2011

(30) Foreign Application Priority Data
Mar. 2, 2009    (JP) .................. 2009-048667

(51) Int. Cl.
*C23C 14/34* (2006.01)
*H01J 37/34* (2006.01)
(Continued)

(52) U.S. Cl.
CPC .............. *C23C 14/3464* (2013.01); *H01J 37/34* (2013.01); *H01J 37/3444* (2013.01); *H02M 1/34* (2013.01); *H02M 7/53871* (2013.01);
(Continued)

(58) Field of Classification Search
CPC .............. C23C 14/352; C23C 14/3485; H01J 37/3463; H01J 37/32045; H01J 37/32027; H01J 37/32036

USPC ....................................................... 204/298.08
See application file for complete search history.

(56) References Cited

U.S. PATENT DOCUMENTS 5,303,139 A    4/1994    Mark
5,584,974 A *  12/1996    Sellers ..................... 204/192.13
(Continued)

FOREIGN PATENT DOCUMENTS

JP    02-079776 A    3/1990
JP    03-195373 A    8/1991
(Continued)

OTHER PUBLICATIONS

International Search Report for PCT Patent App. No. PCT/JP2010/000915 (Apr. 27, 2010).
(Continued)

*Primary Examiner* — John Brayton
(74) *Attorney, Agent, or Firm* — Cermak Nakajima & McGowan LLP; Tomoko Nakajima (57) ABSTRACT

There is provided an AC power supply for a sputtering apparatus in which the AC power supply can prevent the induction of an arc discharge by suppressing an overvoltage to be generated when the polarity of each electrode is reversed. A bridge circuit made up of a plurality of switching transistors SW1-SW4 is disposed between positive and negative DC current output lines from a DC electric power supply source. An inductor DCL which makes a DC output to have a constant-current characteristic is disposed in at least one of the positive and the negative DC output lines from the DC electric power supply source to the bridge circuit, and a snubber circuit is disposed in parallel with inputs of the bridge circuit.

2 Claims, 6 Drawing Sheets

(51) Int. Cl.
*H02M 1/34* (2007.01)
*H02M 7/5387* (2007.01)

(52) U.S. Cl.
CPC ..... *H02M 2001/344* (2013.01); *H01J 37/3467* (2013.01); *C23C 14/3485* (2013.01)

(56) References Cited

U.S. PATENT DOCUMENTS

| | | | | |
|---|---|---|---|---|
| 5,993,613 | A | * | 11/1999 | Manley .................... 204/192.12 |
| 6,096,174 | A | * | 8/2000 | Teschner et al. ......... 204/192.12 |
| 8,262,869 | B2 | * | 9/2012 | Kouznetsov ............. 204/192.13 |
| 2009/0128454 | A1 | * | 5/2009 | Yang .............................. 345/60 |

FOREIGN PATENT DOCUMENTS

| | | |
|---|---|---|
| JP | 06-113561 A | 4/1994 |
| JP | 3639605 B2 | 1/2005 |
| JP | 2005-151779 A | 6/2005 |
| JP | 2009-041082 A | 2/2009 |
| WO | WO2008/032570 A1 | 3/2008 |
| WO | WO2009/145091 A1 | 12/2009 |

OTHER PUBLICATIONS

Office Action for Chinese Patent App. No. 201080008942.4 (Jul. 1, 2013).
Supplementary European Search Report for European Patent App. No. 10748439.6 (Jan. 29, 2014).

* cited by examiner

AC POWER SUPPLY FOR SPUTTERING APPARATUS

This application is a national phase entry under 35 U.S.C. §371 of PCT Patent Application No. PCMP2010/000915, filed on Feb. 15, 2010, which claims priority under 35 U.S.C. §119 to Japanese Patent Application No. 2009-048667, filed March 2, 2009, both of which are incorporated by reference.

TECHNICAL FIELD

The present invention relates to an AC power supply for a sputtering apparatus, the AC power supply being for supplying bipolar pulsed electric power to the sputtering apparatus.

BACKGROUND ART

An AC power supply to supply bipolar pulsed electric power is used, e.g., for a sputtering apparatus which forms a predetermined thin film on a surface of a substrate to be processed (hereinafter referred to as "a to-be-processed substrate"). As an AC power supply of this type, there is known one including a bridge circuit made up of four switching elements (MOSFETs) disposed between a DC electric power supply source and a load. When each of the switching elements of the bridge circuit is appropriately operated to apply an arbitrary pulsed voltage to a couple of targets, which are output terminals (electrodes), with the polarity of the pulsed voltage alternately reversed at a predetermined frequency, then the polarity of each of the targets is alternately switched between an anode electrode and a cathode electrode. A glow discharge is thereby generated between the anode electrode and the cathode electrode, and plasma is generated. Each of the targets is thus sputtered (see, e.g., Patent Document 1).

It is known that an arc discharge (abnormal discharge) is generated in this glow discharge for some cause or another. Because the impedance of plasma (load) rapidly becomes small when an arc discharge is generated, a rapid fall of an output voltage occurs, and consequently an output current rapidly increases. Here, if the targets are especially made of a metal such as aluminum, and the like, the targets get melted when an arc discharge of a large arc current value is locally generated between the targets. Then, the molten parts of the targets are emitted and adhered to the surface of the to-be-processed substrate. That is, particles and splashes (each being a lump having a diameter of several μm to several hundred μm) are generated, and good films cannot be formed.

Now, because an output of a DC electric power supply source generally has a constant voltage characteristic, capacitance components are more dominant than inductance components. The impedance on the plasma load side consequently becomes small (to several ohms or less in some cases) at the time of generation of an arc discharge, and the output and plasma (load) are coupled with each other to be rapidly emitted from the capacitance components to an output side. As a result, a current rise cannot efficiently be suppressed, and there is a problem in that an overcurrent flows in a short time (in several μs) (that is, a current rise rate per unit time at the time of generation of an arc discharge is high).

As one of solutions to such a problem, it is conceivable to dispose an inductor having an inductance value larger than that of plasma in at least one of positive and negative outputs from the DC electric power supply source to the bridge circuit, thereby making each output from the DC electric power supply source to have a constant-current characteristic by means of this inductor.

However, if the output from the DC electric power supply source is made to have a constant-current characteristic by the inductor, the plasma load has an inductance component, and a current rapidly flows into the plasma load at the time of reversing the polarity of each electrode. A spike-like overvoltage is consequently generated at that time. There is thus a fear that such an overvoltage induces an arc discharge.

PRIOR ART DOCUMENT

Patent Document

Patent Document 1: Japanese Patent Publication No. 3639605

DISCLOSURE OF INVENTION

Problem to be Solved by the Invention

In view of the points described above, it is an object of the present invention to provide an AC power supply for a sputtering apparatus in which the AC power supply is capable of preventing induction of an arc discharge by suppressing an overvoltage generated at the time of reversing the polarity of each electrode.

Means for Solving the Problem

In order to solve the problem mentioned above, the present invention is an AC power supply for a sputtering apparatus, the power supply comprising a DC electric power supply source and a bridge circuit made up of a plurality of switching elements connected between positive and negative DC outputs from the DC electric power supply source to supply bipolar pulsed electric power to a couple of electrodes contacting a plasma at a predetermined frequency by switching each of the switching elements of the bridge circuit. The AC power supply comprises: an inductor having an inductance value larger than that of the plasma, the inductor being disposed in at least one of the positive and the negative DC outputs from the DC electric power supply source to the bridge circuit; and a snubber circuit in parallel with inputs to the bridge circuit.

In the present invention, a current rise at the time of the generation of an arc discharge can be limited by the provision of the inductor having the inductance value larger than that of the plasma to at least one of the positive and the negative outputs from the DC electric power supply source to the bridge circuit.

Here, if the output from the DC electric power supply source is made to have a constant-current characteristic by the inductor, a plasma load capacitively coupled with the electrodes has an inductance component and, consequently, a current rapidly flows into the plasma load when the polarity of each of the electrodes is reversed. A spike-like overvoltage is thereby generated. There is a possibility that such an overvoltage induces an arc discharge. In the present invention, the overvoltage to be generated when the polarity of each of the electrodes is reversed can effectively be suppressed by the effective limitation of the rise of an output current when the polarity of each of the electrodes is reversed by the snubber circuit, and thereby the induction of an arc discharge can be prevented.

In the present invention, the snubber circuit is preferably disposed between the inductor and the bridge circuit. The snubber circuit has a diode and a capacitor connected in series with each other and further has a resistor in parallel with the diode.

According to the configuration, no currents from the DC electric power supply source when the polarity of each of the electrodes is reversed flow rapidly into the inductance of the plasma load, and the currents flow into the capacitor in the snubber circuit so as to be charged therein. The voltage of the capacitor in the snubber circuit gradually rises by the charging current, and the output current gently rises according to the capacitor voltage. Consequently, the overvoltage to be generated when the polarity of each of the electrodes is reversed can effectively be suppressed.

In the present invention, the snubber circuit is preferably disposed between the inductor and the bridge circuit. The snubber circuit has a diode and a capacitor connected in series with each other and further has a resistor one end of which is connected to a point between the diode and the capacitor and an opposite end of which is connected to a point between the DC electric power supply source and the inductor.

According to this configuration, because the discharge current from the capacitor of the snubber circuit flows through the inductor even at the time of the generation of an arc, the resistance value of the resistor in the snubber circuit can be made to be small. Consequently, in addition to the effects that can be obtained by the above-mentioned configuration, there can be obtained still further effects in that, because the initial voltage of the capacitor in the snubber circuit can be made to be lower, the above-mentioned overvoltage can be made to be suppressed to be further lower. The loss in the snubber circuit can thereby be lowered, and the efficiency of the AC power supply can be made to be high.

Moreover, if all of the switching elements are turned off for some cause or another, the current flowing through the inductor is rapidly broken, and consequently there is a possibility that an overvoltage is generated, and that a switching element gets out of order owing to the overvoltage. Accordingly, it is normally necessary to provide a flywheel circuit made up of a diode and a resistor connected to each other in series as a protection circuit protecting the switching elements. According to the configuration of the present invention, even if a rapid change of a current flowing through the inductor is generated, the energy of the inductor is emitted through the diode and the resistor in the snubber circuit, and consequently no overvoltages are generated. Consequently, the snubber circuit of the present invention fulfills the role of the flywheel circuit protecting the switching element, and accordingly the flywheel circuit can be omitted to suppress the cost.

Moreover, in the present invention, preferably there may be provided a switching element for short-circuiting the DC output of the DC electric power supply source at a time of switching each of the switching elements of the bridge circuit. A switching loss can thereby be generated only by one output short-circuiting switching element at the time of supplying bipolar pulsed electric power.

BEST MODE FOR CARRYING OUT THE INVENTION

In the following, embodiments of the present invention will be described with reference to the accompanying drawings. Incidentally, the elements common to each of the drawings will be denoted by the same marks, and duplicate descriptions will be omitted.

Figure 1:
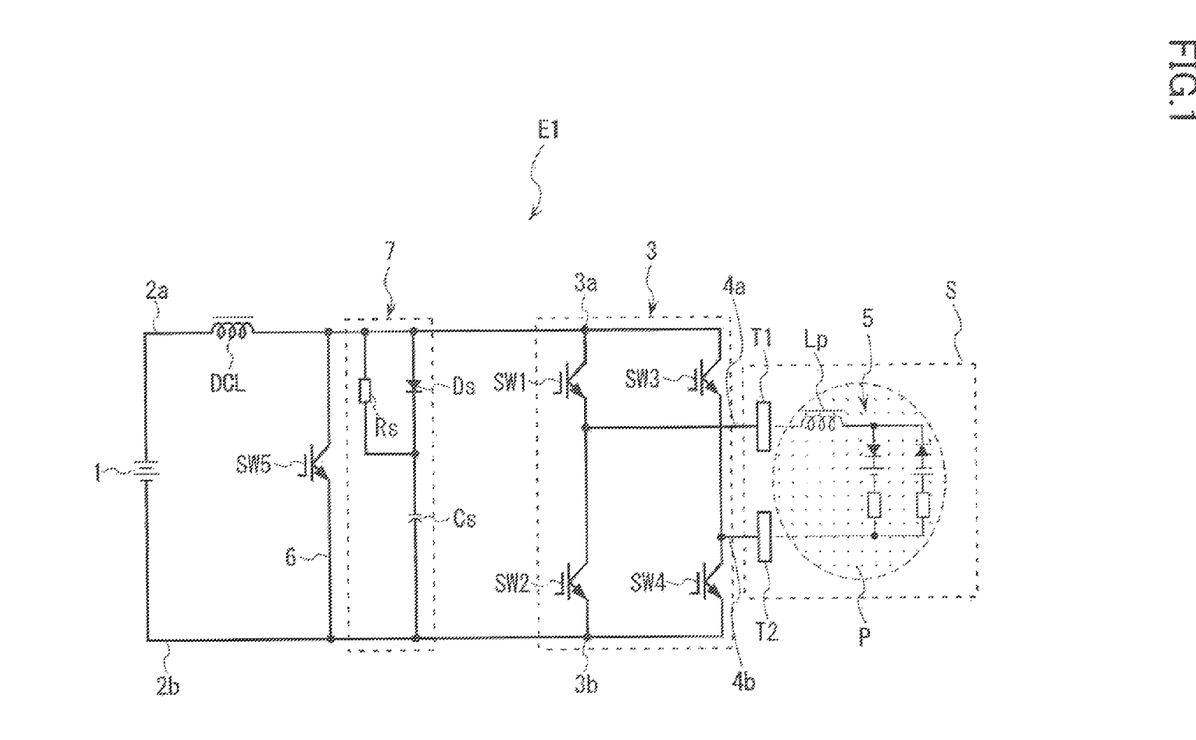
FIG. 1 is a diagram schematically showing the configuration of an AC power supply E1 according to a first embodiment of the present invention.

With reference to FIG. 1, the configuration of an AC power supply E1 according to a first embodiment of the present invention will be described. The AC power supply E1 is an AC pulsed power supply arranged to lie opposite to a to-be-processed substrate, e.g., in a sputtering apparatus S. The AC pulsed power supply is used to supply bipolar pulsed electric power at a predetermined frequency to a couple of targets T1 and T2, these targets being electrodes contacting a plasma load P. Here, the plasma load P can be expressed by an equivalent circuit 5. The equivalent circuit 5 includes an inductance component Lp having an inductance value of 20 μH to 30 μH and is capacitively coupled with the couple of targets T1 and T2.

The AC power supply E1 includes a DC electric power supply source 1, which is made up of an DC power source outputting, e.g., a DC voltage of 500 V. A bridge circuit 3 made up of four switching transistors SW1-SW4 is provided between positive and negative output lines 2a and 2b from the DC electric power supply source 1.

The ON-OFF switching of each of the switching transistors SW1-SW4 of the bridge circuit 3 is controlled by a driver circuit (not illustrated). For example, if the timing of switching-on and switching-off of the first and the fourth switching transistors SW1 and SW4 and the timing of switching-on and switching-off of the second and the third switching transistors SW2 and SW3 are controlled so as to be reversed, then bipolar pulsed electric power is supplied to the couple of targets T1 and T2 through output lines 4a and 4b from the bridge circuit 3.

When each of the switching transistors SW1-SW4 is switched in a state in which electric power is being supplied thereto from the DC electric power supply source 1 configured as described above, the switching loss of each of the switching transistors SW1-SW4 becomes great. It is accordingly required to provide a configuration to improve the durability of each of the switching transistors SW1-SW4. In the present embodiment, a switching transistor SW5 for short-circuiting an output is provided between the positive and the negative output lines 2a and 2b from the DC electric power supply source 1. The switching of each of the switching transistors SW1-SW4 is performed in a short-circuited (ON) state of the switching transistor SW5.

Figure 2:
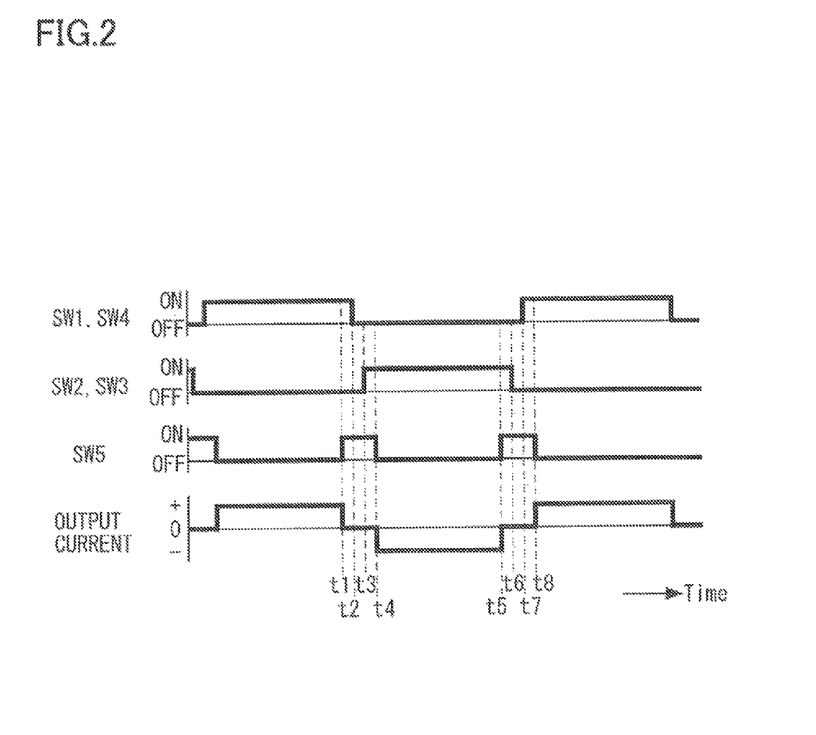
FIG. 2 is a diagram for describing output control of the AC power supply E1 by the first embodiment of the present invention.

That is, as shown in FIG. 2, when bipolar pulsed electric power is supplied to the couple of targets T1 and T2, the switching transistor SW5 is made to be a short-circuited state (ON), e.g., at a time t1. The current that has been flowing through the plasma load P until the time t1 flows into a short circuit path 6 by the change to the short-circuited state, and the current consequently flows by bypassing the plasma load P.

Then, the first and the fourth switching transistors SW1 and SW4 are turned off at a time t2, at which the switching transistor SW5 is in the short-circuited state, and the second and the third switching transistors SW2 and SW3 are turned on at a time t3 after the time t2. After that, the short-circuited state of the switching transistor SW5 is released (OFF) at a time t4. By the release of the short-circuited state, the current that was flowing through the short circuit path 6 until that time flows into the switching transistor SW3, the plasma load P, and the switching transistor SW2 in that order, and consequently an output current having a negative polarity rises. Here, the period during which the switching transistor SW5 is ON (the time from t1 to t4 shown in FIG. 2) is, e.g., several μs.

Next, by short-circuiting the switching transistor SW5 again at a time t5, the current flows into the short circuit path 6 by bypassing the plasma load P. Then, the second and the third switching transistors SW2 and SW3 are turned off at a time t6, and, after that, the first and the fourth switching transistors SW1 and SW4 are turned on at a time t7. After that, the short-circuited state of the switching transistor SW5 is turned off at a time t8. The current that was flowing through the short circuit path 6 until that time thereby flows into the switching transistor SW1, the plasma load P, and the switching transistor SW4 in that order, and consequently an output current having a position polarity rises.

Incidentally, although the turning-on and the turning-off of the switching transistors SW1-SW4 are performed at different timing in the example shown in FIG. 2, the turning-on and the turning-off may be performed at the same timing. Moreover, when the first and the fourth switching transistors SW1 and SW4 are turned off from their turned-on states, and the second and the third switching transistors SW2 and SW3 are turned on from their turned-off states, the following arrangement may be made, namely, the second and the third switching transistors SW2 and SW3 may be turned on before the first and the fourth switching transistors SW1 and SW4 are turned off, and, after that, the first and the fourth switching transistors SW1 and SW4 may be turned off. In other words, all of the four switching transistors SW1-SW4 are turned on to form a short-circuited state in place of using the switching transistor SW5.

Then, by repeating the aforesaid control under which the timing of turning on and turning off each of the switching transistors SW1-SW4 are reversed, bipolar pulsed electric power is supplied between the couple of targets T1 and T2 at a predetermined frequency. At that time, in a state in which a sputtering gas, such as Ar, is introduced into the sputtering apparatus S that is maintained at a predetermined pressure, the couple of targets T1 and T2, to which the electric power is supplied while alternately varying the polarity at a predetermined frequency, are alternately switched between the anode electrode and the cathode electrode. A glow discharge is caused to be generated between the anode electrode and the cathode electrode, thereby forming a plasma, so that each of the targets T1 and T2 can be sputtered. At this time, the switching loss generated at the time of an output to the targets T1 and T2 is generated only by the switching transistor SW5 for short-circuiting, and the switching loss is hardly generated by each of the switching transistors SW1-SW4.

Here, if an output having a constant voltage characteristic from a DC electric power supply source is supplied to the targets T1 and T2 like a conventional AC power supply, then the impedance on the side of the plasma load becomes low at the time of arc discharging for some cause or another during glow discharging, and a large arc current is generated.

In the present embodiment, an inductor (direct-current reactor) DCL having an inductance value (for example, 5 mH) which is larger than the inductance value of the plasma P is disposed on the positive output line 2a in order to suppress the generation of such an arc current. The output from the DC electric power supply source 1 is made to have a constant-current characteristic by the inductor DCL. In order to make the output from the DC electric power supply source 1 to have the constant-current characteristic, it is only necessary to set the inductance value of the inductor DCL to 1 mH or more. Because a current rise rate at the time of arc discharge generation can be suppressed by disposing the inductor DCL on the positive output line 2a, the generation of an arc current can be suppressed.

Incidentally, although the inductor DCL is disposed on the positive output line 2a in the present embodiment, the position of disposing the inductor DCL is not limited to that position, but the inductor DCL may be disposed on the negative output line 2b or on both of the positive and the negative output lines 2a and 2b.

If the inductor DCL is disposed on the output line 2a, the short-circuiting switching transistor SW5 is turned on and off as described above when each of the switching transistors SW1-SW4 is switched at a predetermined frequency (e.g., 5 kHz), that is, when the polarity of each of the targets T1 and T2 is reversed. When the switching transistor SW5 is turned off, the output current rises. That is, the current that was short-circuited just before the turning-off of the switching transistor SW5 flows into the plasma load P that is capacitively coupled with the targets T1 and T2. Because the plasma load P has the inductance component Lp, a spike-like (of a value near double the steady value) overvoltage is generated when a current rapidly flows in. It is apprehended that such an overvoltage induces an arc discharge.

In the present embodiment, a snubber circuit 7 is provided in parallel with the inputs 3a and 3b of the bridge circuit 3 in order to suppress the spike-like overvoltage by suppressing the rise of an output current when the polarity of each of the targets T1 and T2 is reversed. The snubber circuit 7 includes a snubber diode Ds and a snubber capacitor Cs disposed between the inductor DCL and the bridge circuit 3 and connected to each other in series. If the capacitance of the snubber capacitor Cs is less than 5 μF, there is a possibility that the rise of an output current cannot effectively be suppressed. If the capacitance exceeds 20 μF, there is a possibility that free discharges increase. Accordingly, the capacity of the snubber capacitor Cs is preferably set to be within a range of, e.g., from 5 μF to 20 μF. Furthermore, the snubber circuit 7 includes a snubber resistor Rs in parallel with the snubber diode Ds. Because the snubber resistor Rs functions as a discharge resistance, the voltage of the snubber diode Ds can be prevented from becoming too high.

Figure 3:
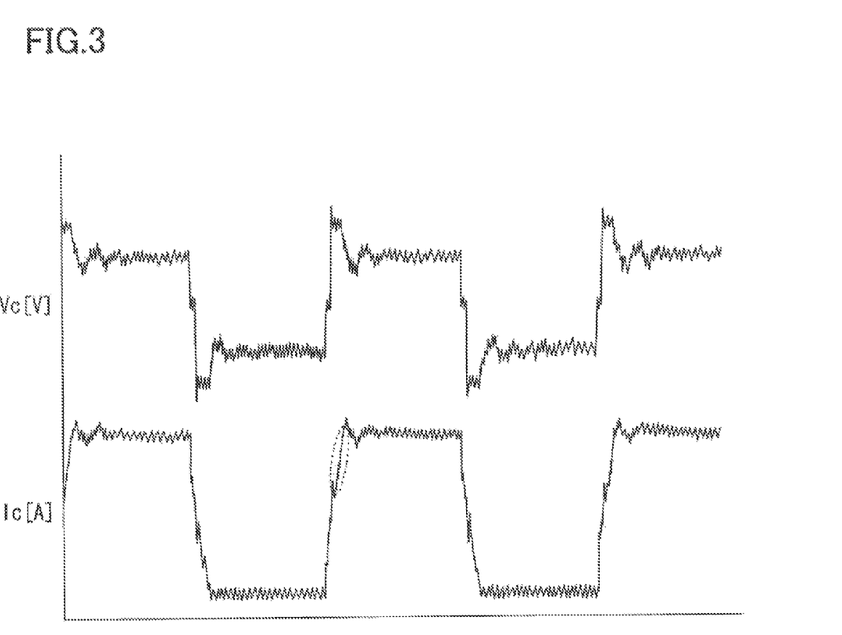
FIG. 3 is a diagram for describing waveforms of an output voltage and an output current to one of the electrodes of the AC power supply E1.

According to the snubber circuit 7 of the present embodiment, if the switching transistor SW5 is turned off when the polarity of each of the targets T1 and T2 is reversed, the current that was flowing through the short circuit path 6 flows into the snubber capacitor Cs through the snubber diode Ds. Then, the current flowing through the plasma load P through the targets T1 and T2 gradually rises as the charged voltage of the snubber capacitor Cs rises. As a result, the rise of an output current Ic becomes gentle when the polarity of each of the targets T1 and T2 reverses as shown in FIG. 3 by enclosing with the broken line (incidentally, FIG. 3 shows only changes of the output voltage Vc and the output current Ic of one target), and consequently the overvoltage when the polarity of each of the targets T1 and T2 is reversed can effectively be suppressed. The induction of an arc discharge can be prevented.

Here, it is desirable to make the resistance value of the snubber resistor Rs be small so that the charging voltage of the snubber capacitor Cs may be low in order to suppress the overvoltage when the polarity of each of the targets T1 and T2 is reversed. On the other hand, if the resistance value of the snubber resistor Rs is made to be too small, the discharge current of the snubber capacitor Cs flowing through the snubber resistor Rs becomes large when an arc discharge is generated in the plasma load P, and excessive arc energy is supplied to the plasma load P. In the present embodiment, it is preferable to set the resistance value of the snubber resistor Rs to be within a range, e.g., of 20-50 Ω.

Figure 4:
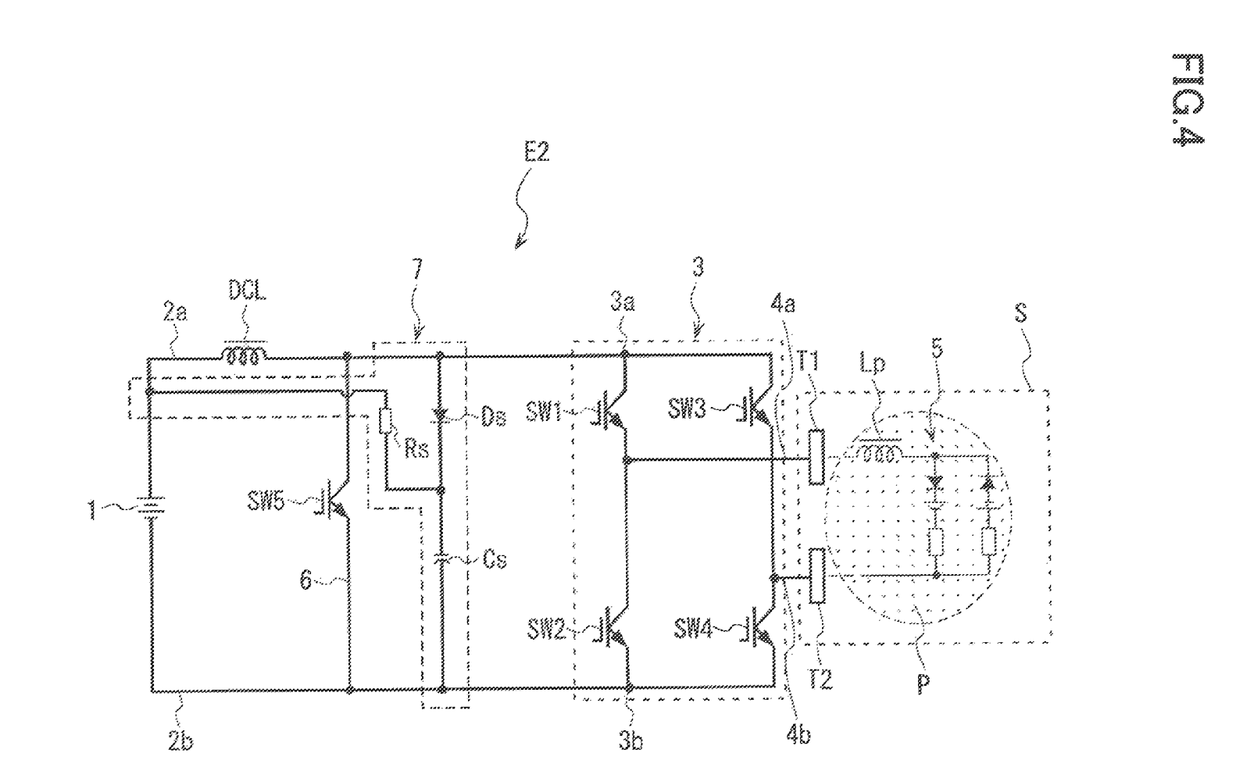
FIG. 4 is a diagram schematically showing the configuration of an AC power supply E2 according to a second embodiment of the present invention.

Next, with reference to FIG. 4, the configuration of the AC power supply E2 of a second embodiment will be described. In the AC power supply E2, the connection position of one end of the snubber resistor Rs constituting the snubber circuit 7 is different from that of the AC power supply E1 described above. That is, one end of the snubber resistor Rs is connected to a point between the DC electric power supply source 1 and the inductor DCL. The other end of the snubber resistor Rs is connected to a point between the cathode of the snubber diode Ds and the snubber capacitor Cs in a manner similar to the arrangement in the AC power supply E1. The other configurations of the AC power supply E2 and the switching control of the switching transistors SW1-SW4 and the short-circuiting switching transistor SW5 are similar to those of the AC power supply E1, and their detailed descriptions are accordingly omitted.

Figure 5:
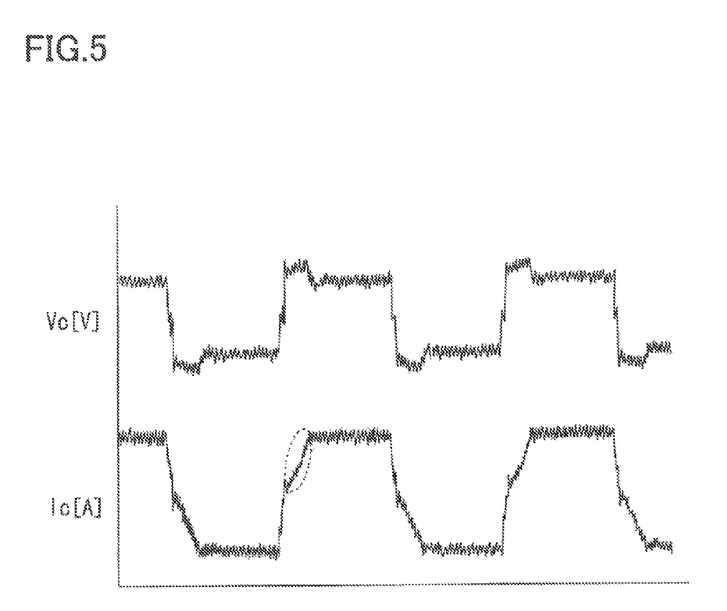
FIG. 5 is a diagram for describing waveforms of an output voltage and an output current to one of the electrodes of the AC power supply E2.

According to the AC power supply E2 of the present embodiment, if the switching transistor SW5 is turned off when the polarity of each of the targets T1 and T2 is reversed, the current that was flowing through the short circuit path 6 flows into the snubber capacitor Cs through the snubber diode Ds. Then, the current flowing through the plasma load P through the targets T1 and T2 gradually rises as the charging voltage of the snubber capacitor Cs rises in a manner similar to that of the AC power supply E1 of the first embodiment. As a result, the rise of the output current Ic becomes gentle as shown in FIG. 5 by being enclosed by a broken line, and consequently the overvoltage is effectively suppressed. The induction of an arc discharge can thus be prevented.

Here, in present embodiment, the voltage of the snubber capacitor Cs just before the turning-off of the switching transistor SW5 is clamped to the voltage of the DC electric power supply source 1, and consequently the charging voltage of the snubber capacitor Cs after the turning-off of the switching transistor SW5 becomes lower than that of the first embodiment (see FIG. 3), and the overvoltage can further be suppressed.

Moreover, if all of the switching transistors SW1-SW4 is turned off for some cause or another, the current flowing through the inductor DCL is rapidly broken, and consequently an overvoltage is generated. Consequently, there is a possibility that the switching transistors SW1-SW4 get out of order by the overvoltage. Accordingly, it is normally necessary to provide a flywheel circuit made up of a diode and a resistor connected with each other in series as a protection circuit protecting the switching transistors SW1-SW4.

In the present embodiment, even if a rapid change of a current flowing through the inductor DCL is produced, the energy of the inductor DCL is emitted through the snubber diode Ds and the snubber resistor Rs of the snubber circuit 7, and no overvoltages are consequently generated. The snubber circuit 7 consequently fulfills the role of the flywheel circuit for protecting the switching transistors SW1-SW4, and the flywheel circuit can accordingly be omitted. The cost can thereby be suppressed.

Moreover, even if an arc discharge is generated in the plasma load P for some cause or another, the discharge of the snubber capacitor Cs is performed through the inductor DCL. Consequently, even if the resistance value of the snubber resistor Rs is set to be small, the discharge current from the snubber capacitor Cs does not become excessive. The resistance value of the snubber resistor Rs can accordingly be set to be, e.g., in a range of from several Ω to several tens Ω which is mailer than that of the first embodiment. The initial voltage of the snubber capacitor Cs can thereby be made to be low, and the overvoltage generated after the turning-off of the switching capacitor SW5 can be suppressed to be further lower. The loss of the snubber circuit 7 can be made to be about 75% of that of the first embodiment, and the effect of being capable of increasing the efficiency of power source can further be obtained.

Figure 6:
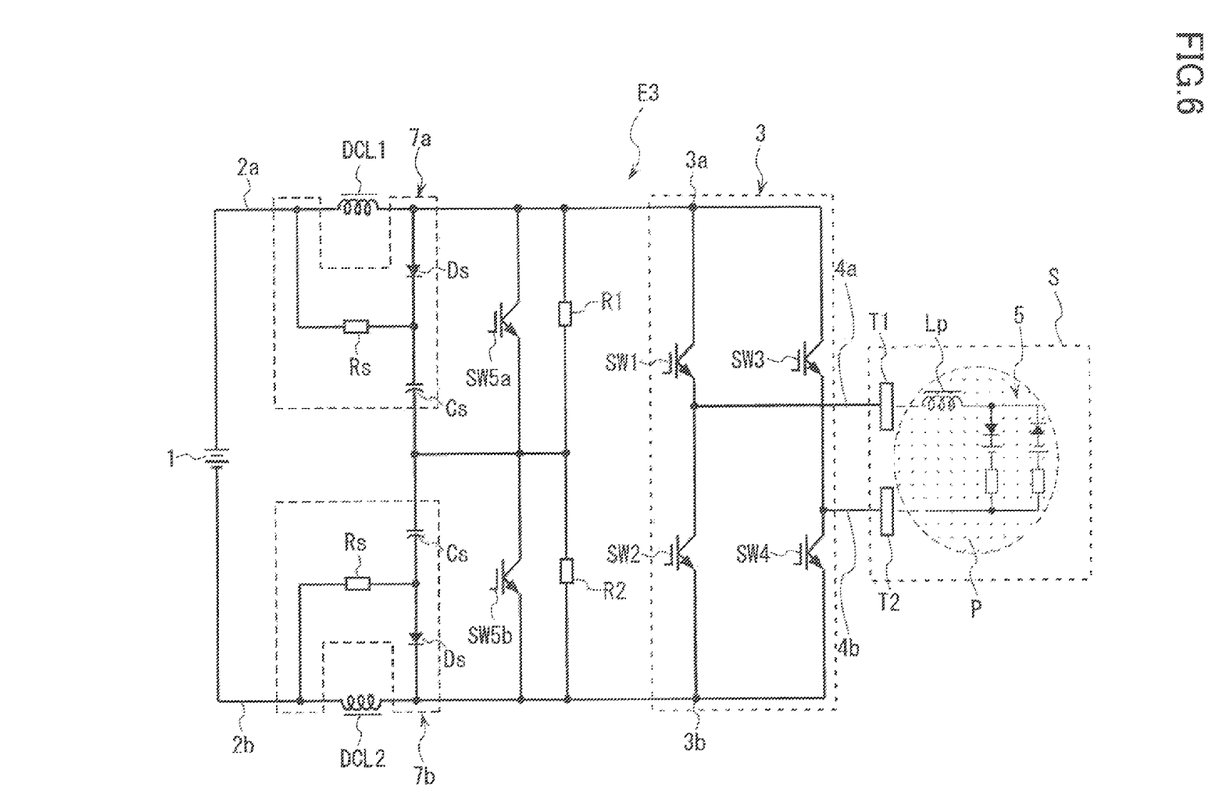
FIG. 6 is a diagram schematically showing the configuration of an AC power supply E3 according to a modification of the present invention.

Incidentally, the present invention is not limited to the embodiments described above, but can be carried out by variously changing the embodiments without departing from the spirit of the present invention. For example, as the AC power supply E3 shown in FIG. 6, the configuration in which two snubber circuits 7a and 7b are connected with each other in series may be employed. In the AC power supply E3, inductors DCL1 and DCL2 are disposed on both of the positive and the negative output lines 2a and 2b, respectively. Then, switching transistors SW5a and SW5b and resistors R1 and R2 are provided in parallel with the serial circuits of the snubber diodes Ds and the snubber capacitors Cs constituting the snubber circuits 7a and 7b, respectively. These resistors R1 and R2 are voltage dividing resistors for dividing the application voltages to each of the snubber circuits 7a and 7b. The other configurations of the AC power supply E3 and the switching control of the switching transistors SW1-SW4 are similar to those of the AC power supply E2, and accordingly their detailed descriptions are omitted. According to the AC power supply E3, the effect of enabling the snubber circuits 7a and 7b to have a withstand voltage can further be obtained in addition to the effects obtained by the AC power supply E2.

DESCRIPTION OF REFERENCE MARKS

E1, E2, E3 AC power supply
S sputtering apparatus
P plasma load
T1, T2 target (electrode)
DCL inductor
SW5 short-circuiting switching transistor
1 DC electric power supply source
2a, 2b output line
3 bridge circuit
SW1-SW4 switching transistor
7 snubber circuit
$D_S$ snubber diode
$C_S$ snubber capacitor
$R_S$ snubber resistor

What is claimed is:

1. An AC power supply for a sputtering apparatus, the power supply comprising a DC electric power supply source and a bridge circuit made up of a plurality of switching elements connected between positive and negative DC outputs from the DC electric power supply source to supply bipolar pulsed electric power to two sputtering targets contacting a plasma at a predetermined frequency by switching each of the switching elements of the bridge circuit, wherein the AC power supply comprises:
- an inductor having a predetermined inductance value, the inductor being disposed in at least one of the positive and the negative DC outputs from the DC electric power supply source to the bridge circuit; and
- a snubber circuit in parallel with inputs to the bridge circuit,
- wherein the snubber circuit is disposed between the inductor and the bridge circuit, the snubber circuit having a diode and a capacitor connected in series with each other, the snubber circuit further having a resistor one end of which is in connection between the diode and the capacitor and an opposite end of which is in connection between the DC electric power supply source and the inductor.

2. The AC power supply for a sputtering apparatus according to claim 1, further comprising:
- a switching element for short-circuiting a DC output of the DC electric power supply source at a time of switching each of the switching elements of the bridge circuit.

* * * * *